(12) United States Patent
Gómez Correa et al.

(10) Patent No.: US 11,121,721 B2
(45) Date of Patent: *Sep. 14, 2021

(54) METHOD OF ERROR CONCEALMENT, AND ASSOCIATED DEVICE

(71) Applicant: STMicroelectronics S.r.l., Agrate Brianza (IT)

(72) Inventors: Marta Gómez Correa, Milan (IT); Fabio Dell'Orto, Lissone (IT); Muhammad Umair Saeed, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/937,016

(22) Filed: Jul. 23, 2020

(65) Prior Publication Data
US 2020/0358453 A1 Nov. 12, 2020

Related U.S. Application Data

(63) Continuation of application No. 16/675,051, filed on Nov. 5, 2019, now Pat. No. 10,763,885.

(Continued)

(51) Int. Cl.
*H04B 14/06* (2006.01)
*H03M 3/04* (2006.01)
(Continued)

(52) U.S. Cl.
CPC .......... *H03M 3/042* (2013.01); *G10L 19/005* (2013.01); *G10L 19/008* (2013.01); *G10L 19/04* (2013.01);
(Continued)

(58) Field of Classification Search
CPC ... H03M 3/042; H03M 7/3044; G10L 19/008; G10L 19/04; G10L 19/005; H04B 14/064; H04B 14/068
(Continued)

(56) References Cited

U.S. PATENT DOCUMENTS 5,235,420 A  8/1993 Gharavi
5,640,431 A * 6/1997 Bruckert ............... H04B 1/707
                                                        375/344

(Continued)

FOREIGN PATENT DOCUMENTS

WO       9950828 A1    10/1999

OTHER PUBLICATIONS

Egiazarian, Karen et al., "Part V.F: Cosine-Modulated Filter Banks", Part 3, https://www.cs.tut.fi/~ts/partv3.pdf, 15 pages. No Date.
(Continued)

*Primary Examiner* — Don N Vo
(74) *Attorney, Agent, or Firm* — Slater Matsil, LLP

(57) ABSTRACT

In an embodiment, a method includes: receiving an audio frame; decomposing the received audio frame into M sub-band pulse-code modulation (PCM) audio frames, where M is a positive integer number; predicting a PCM sample of one sub-band PCM audio frame of the M sub-band PCM audio frames; comparing the predicted PCM sample with a corresponding received PCM sample to generate a prediction error sample; comparing an instantaneous absolute value of the prediction error sample with a threshold; and replacing the corresponding received PCM sample with a value based on the predicted PCM sample when the instantaneous absolute value of the prediction error sample is greater than the threshold.

24 Claims, 9 Drawing Sheets

Related U.S. Application Data

(60) Provisional application No. 62/756,397, filed on Nov. 6, 2018.

(51) Int. Cl.
  *G10L 19/04* (2013.01)
  *G10L 19/008* (2013.01)
  *H03M 7/36* (2006.01)
  *G10L 19/005* (2013.01)

(52) U.S. Cl.
  CPC ........ *H03M 7/3044* (2013.01); *H04B 14/064* (2013.01); *H04B 14/068* (2013.01)

(58) Field of Classification Search
  USPC .......................................................... 375/245
  See application file for complete search history.

(56) References Cited

U.S. PATENT DOCUMENTS

| | | | |
|---|---|---|---|
| 5,956,674 | A | 9/1999 | Smyth et al. |
| 7,003,448 | B1 | 2/2006 | Lauber et al. |
| 8,219,393 | B2 | 7/2012 | Oh et al. |
| 8,239,192 | B2 | 8/2012 | Kovesi et al. |
| 8,301,440 | B2 | 10/2012 | Zopf et al. |
| 8,843,798 | B2 | 9/2014 | Sung et al. |
| 9,916,833 | B2 | 3/2018 | Schnabel et al. |
| 2002/0123887 | A1 | 9/2002 | Unno |
| 2005/0154584 | A1 | 7/2005 | Jelinek et al. |
| 2007/0198254 | A1 | 8/2007 | Goto et al. |
| 2007/0271480 | A1 | 11/2007 | Oh et al. |
| 2011/0007827 | A1 | 1/2011 | Virette et al. |
| 2011/0099008 | A1* | 4/2011 | Zopf ............... G10L 19/005 704/219 |
| 2011/0224995 | A1 | 9/2011 | Kovesi et al. |
| 2012/0137189 | A1 | 5/2012 | Macours |
| 2014/0036998 | A1 | 2/2014 | Narroschke et al. |
| 2015/0317977 | A1 | 11/2015 | Manjunath et al. |

OTHER PUBLICATIONS

ETSI TS 103 466 V1.1.1, "Digital Audio Broadcasting (DAB); DAB Audio Coding (MPEG Layer II)", Oct. 2016, France, 59 pages.

Hoeg, Wolfgang et al., "Principles and Applications of Digital Radio", Digital Audio Broadcasting, Second Edition, Jan. 2004, 359 pages.

CD 11172-3, "Coding of Moving Pictures and Associated Audio for Digital Storage Media at up to about 1.5 MBIT/s: Part 3 Audio", ISO/IEC 11172-3, Aug. 1993, 39 pages.

ISO/IEC 14496-3, "Information Technology—Coding of Audio-Visual Objects, International Standard, Part 3: Audio," Secondary Edition, Reference No. ISO/IEC 14496-3:2001(E), Dec. 15, 2001, 110 pages.

Proakis, "Principles, Algorithms, and Applications", Digital Signal Processing, Fourth Edition, Apr. 7, 2006, 1087 pages.

Saramaki, Tapoi et al., "Multirate Systems and Filter Banks", Chapter 2 in Multirate Systems: Design and Applications, Tampere, Finland, Jul. 1, 2001, pp. 27-85.

Vaidyanathan, P.P., "Synthesis Lectures on Signal Processing #3", The Theory of Linear Prediction, Morgan & Claypool Publishers, Dec. 2008, 180 pages.

* cited by examiner

Prior Art

| SB. No. | Center Frequency (Hz) | Frequency Span (Hz) | SB. No. | Center Frequency (Hz) | Frequency Span (Hz) |
|---|---|---|---|---|---|
| 0 | 375 | 0 - 750 | 16 | 12375 | 12000 - 12750 |
| 1 | 1125 | 750 - 1500 | 17 | 13125 | 12750 - 13500 |
| 2 | 1875 | 1500 - 2250 | 18 | 13875 | 13500 - 14250 |
| 3 | 2625 | 2250 - 3000 | 19 | 14625 | 14250 - 15000 |
| 4 | 3375 | 3000 - 3750 | 20 | 15375 | 15000 - 15750 |
| 5 | 4125 | 3750 - 4500 | 21 | 16125 | 15750 - 16500 |
| 6 | 4875 | 4500 - 5250 | 22 | 16875 | 16500 - 17250 |
| 7 | 5625 | 5250 - 6000 | 23 | 17625 | 17250 - 18000 |
| 8 | 6375 | 6000 - 6750 | 24 | 18375 | 18000 - 18750 |
| 9 | 7125 | 6750 - 7500 | 25 | 19125 | 18750 - 19500 |
| 10 | 7875 | 7500 - 8250 | 26 | 19875 | 19500 - 20250 |
| 11 | 8625 | 8250 - 9000 | 27 | 20625 | 20250 - 21000 |
| 12 | 9375 | 9000 - 9750 | 28 | 21375 | 21000 - 21750 |
| 13 | 10125 | 9750 - 10500 | 29 | 22125 | 21750 - 22500 |
| 14 | 10875 | 10500 - 11250 | 30 | 22875 | 22500 - 23250 |
| 15 | 11625 | 11250 - 12000 | 31 | 23625 | 23250 - 24000 |

Prior Art

METHOD OF ERROR CONCEALMENT, AND ASSOCIATED DEVICE

CROSS-REFERENCE TO RELATED APPLICATIONS

This application is a continuation of U.S. patent application Ser. No. 16/675,051, filed Nov. 5, 2019, which application claims the benefit of U.S. Provisional Application No. 62/756,397, entitled "Method of Error Concealment, and Associated Device," and filed on Nov. 6, 2018, which applications are hereby incorporated herein by reference.

TECHNICAL FIELD

The present invention relates generally to an electronic system and method, and, in particular embodiments, to a method of error concealment, and associated device.

BACKGROUND

Digital Audio Broadcasting (DAB) is a digital radio standard for broadcasting digital radio services. DAB is an innovative and universal multimedia broadcast system that is replacing existing AM and FM audio broadcast services in many parts of the world. Compared with the traditional FM and AM broadcasting technology, DAB typically exhibits better audio quality and provides more services at a lower transmission cost.

Besides high-quality digital audio services (mono, two-channel or multichannel stereophonic), DAB can transmit Program Associated Data (PAD) and a multiplex of other data services (e.g., travel and traffic information, still and moving pictures, etc.).

DAB is well suited for mobile reception and provides very high robustness against multipath reception. DAB receivers are used, for example, in infotainments systems of cars.

DAB receivers generally implement error correction techniques to correct errors generated during transmission (from a transmitter to a receiver). For example, some DAB receivers use error correction in a channel decoder such as Viterbi Decoder. However, some residual bit errors may not be corrected. Some DAB receivers may attempt to conceal such residual errors using techniques at a frame level. For example, some DAB receivers mute the receiver output for a duration of a frame containing errors. Other DAB receivers replace (i.e., discard) an erroneous frame with an adjacent frame (i.e., frame repetition), or, in the case of a stereo system, with the frame of the other channel (i.e., frame substitution). DAB receivers implementing error concealment using frame repetition or frame substitution use additional memory to temporarily store decoded frames for use in concealing errors. Another approach is described in U.S. Patent Publication No. 2012/0137189.

SUMMARY

In accordance with an embodiment, a method includes: receiving an audio frame; decomposing the received audio frame into M sub-band pulse-code modulation (PCM) audio frames, where M is a positive integer number; predicting a PCM sample of one sub-band PCM audio frame of the M sub-band PCM audio frames; comparing the predicted PCM sample with a corresponding received PCM sample to generate a prediction error sample; comparing an instantaneous absolute value of the prediction error sample with a threshold; and replacing the corresponding received PCM sample with a value based on the predicted PCM sample when the instantaneous absolute value of the prediction error sample is greater than the threshold.

In accordance with an embodiment, a digital audio broadcasting (DAB) receiver includes: a frame unpacking block configured to receive an encoded frame; a reconstruction block configured to generate M sub-band frames based on the encoded frame; a linear predictor configured to receive one sub-band frame of the M sub-band frames and to generate a predicted sample based on a corresponding received sample; a first block configured to generate a prediction error based on the predicted sample and the corresponding received sample; a comparator configured to assert a flag when an instantaneous absolute value of the prediction error is higher than a threshold; and a selector block configured to select the predicted sample when the flag is asserted.

In accordance with an embodiment, a method of concealing an error in a pulse-code modulation (PCM) audio frame encoded with an MPEG Version 1 Layer II (MP2) encoding scheme includes: receiving the PCM audio frame; decomposing the received PCM audio frame into 32 sub-band PCM audio frames; predicting a PCM sample of one sub-band PCM audio frame of the 32 sub-band PCM audio frames using a linear predictor based on PCM samples of the received PCM audio frame; comparing the predicted PCM sample with a corresponding received PCM sample to generate a prediction error sample; comparing an instantaneous absolute value of the prediction error sample with a threshold; and replacing the corresponding received PCM sample with the predicted PCM sample when the instantaneous absolute value of the prediction error sample is greater than the threshold.

In accordance with an embodiment, an audio decoder includes: a frame unpacking block configured to receive an encoded frame; a reconstruction block configured to generate M sub-band frames based on the encoded frame; and an error detection and concealment block including: a linear predictor configured to receive one sub-band frame based on the M sub-band frames and to generate a predicted sample based on a corresponding received sample, an adder block configured to generate a prediction error based on the predicted sample and the corresponding received sample, a comparator configured to assert a flag when an instantaneous absolute value of the prediction error is higher than a threshold, and a selector block configured to select the predicted sample when the flag is asserted.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a DAB receiver implementing error detection and concealment. Embodiments of the present invention may be used in other systems, such as AM High Definition (AM HD) and FM High Definition (FM HD) receivers, as well as DAB+ and Digital Radio Mondiale (DRM) receivers. Some embodiments may be used, e.g., in applications based on signals transmitted or stored in memory with a sub-band decomposition, such as signals from an array of physical sensors (e.g., thermal sensors) that are frequency multiplexed in a unique channel.

Figures 1A, 1B:
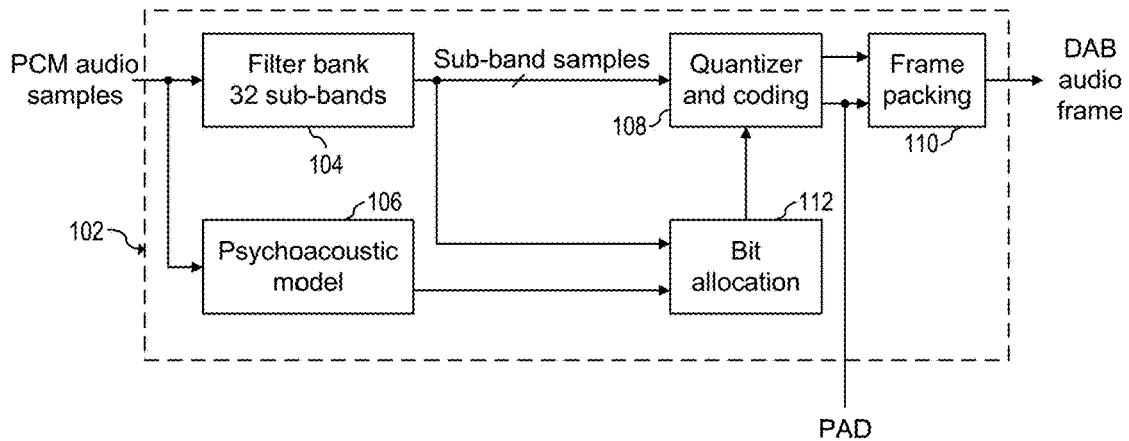
FIG. 1A shows a schematic diagram of an MPEG Version 1 Layer II (MP2) encoder.
FIG. 1B shows a table illustrating the 32 sub-bands used in the MP2 encoding scheme

In some applications, audio signals are encoded for spectrum management of terrestrial DAB (T-DAB) services. For example, FIG. 1A shows a schematic diagram of MPEG Version 1 Layer II (MP2) encoder 102. Audio encoder 102 has been used in DAB services.

As shown in FIG. 1A, the input pulse-code modulation (PCM) audio samples are fed into audio encoder 102. Filter bank 104 creates 32 frequency sub-bands, where each sub-band includes a filtered sub-sampled representation of the input PCM audio signal, also known as sub-band samples. Psychoacoustic model 106 of the human ear creates a set of data to control quantizer and coding block 108. Bit allocation block 112 provides time-varying assignment of bits to samples in different sub-bands, according to a psychoacoustic model. Quantizer and coding block 108 creates a set of coding symbols from the sub-band samples. Frame packing block no assembles DAB audio frames (i.e., the actual audio bit stream) from the output data of quantizer and coding block 108 to include the sub-band samples, and adds other information, such as header information, cyclic redundancy check (CRC) words for error detection and Program Associated Data (PAD).

For a sampling frequency of 48 kHz, each DAB audio frame corresponds to 24 ms duration of audio and complies with the Layer II format, ISO/IEC 11172-3. For a sampling frequency of 24 kHz, each DAB audio frame corresponds to 48 ms duration of audio and complies with the Layer II LSF format, ISO/IEC 13818-3.

FIG. 1B shows a table illustrating the 32 sub-bands used in the MP2 encoding scheme. As shown, each sub-band has a bandwidth of 750 Hz for a sampling rate of 48 kHz.

Figure 1C:
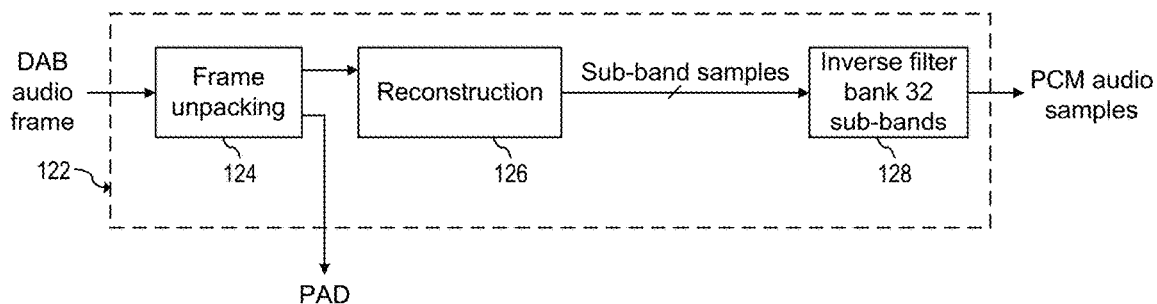
FIG. 1C shows a schematic diagram of an MP2 decoder.

FIG. 1C shows a schematic diagram of MP2 decoder 122. Audio decoder 122 has been used in DAB services. As shown in FIG. 1C, audio decoder 122 receives DAB audio frames, which are unpacked by frame unpacking block 124. Reconstruction block 126 receives the unpacked frames and extracts the 32 sub-band frames from each unpacked frame. Inverse filter bank 128 generates the PCM audio samples (arranged in frames) by mapping (i.e., recombining) the sub-band frames into recombined PCM frames.

Figure 2:
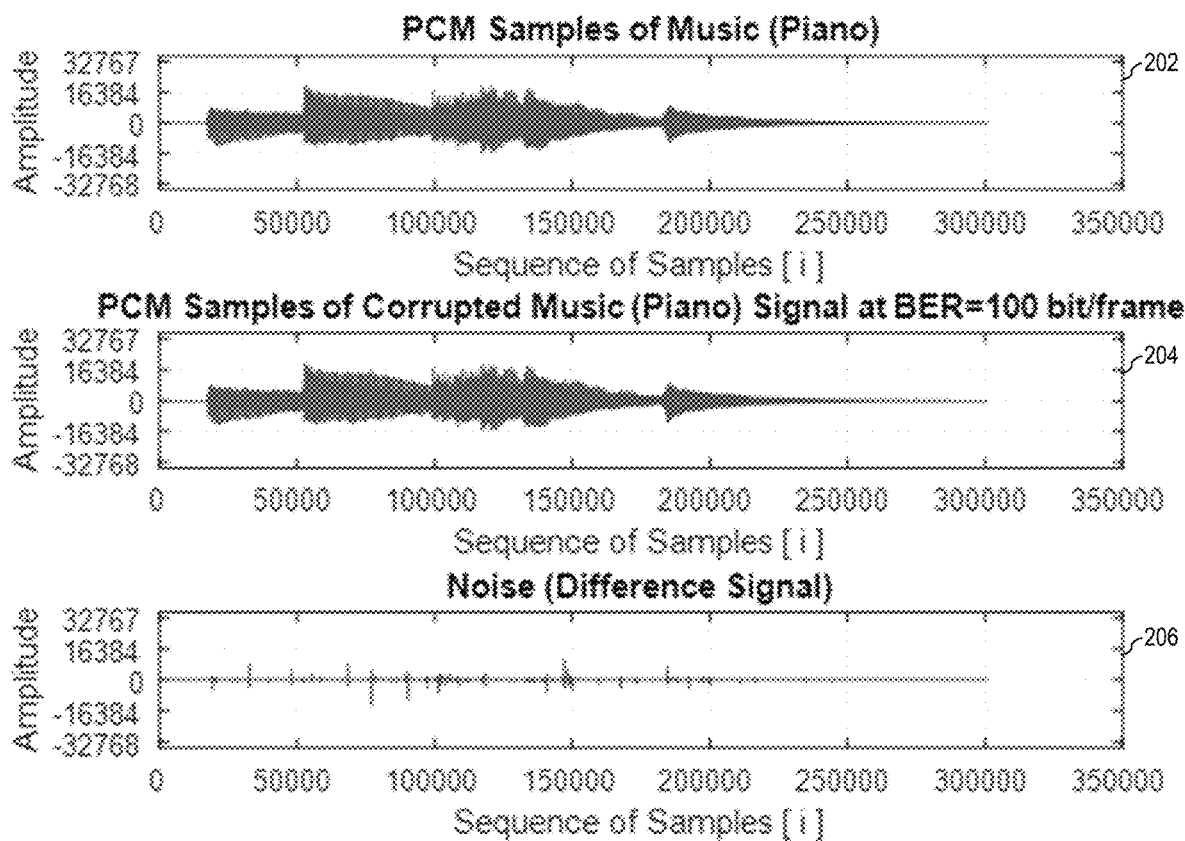
FIG. 2 shows graphs of an example of original and corrupted pulse-code modulation (PCM) samples.

Transmission errors such as isolated bit errors in an audio stream may generate time domain discontinuities that are audible as a band-limited "click" noise. Bit-error bursts tend to randomize the time domain signal of the corrupted signal, which is audible as a band-limited white noise. Bit errors may be present in some sub-bands but not in others, and the location of bit errors in multiple sub-bands may be different. Bit errors in audio stream, thus may be difficult to detect, as illustrated, for example in graphs 202, 204 and 206 of FIG. 2.

In an embodiment of the present invention, bit errors in the PCM audio stream received from an encoder are detected and concealed by processing PCM samples in individual sub-band frames. A prediction block is used to detect PCM sample errors as well as to conceal a detected error in a corresponding sub-band.

Figure 3:
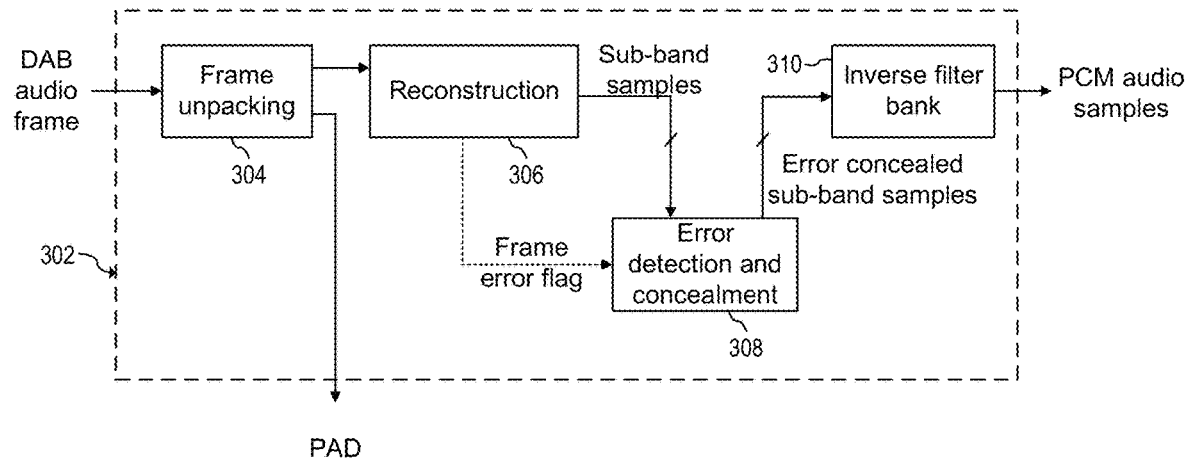
FIG. 3 shows a schematic diagram of a decoder, according to an embodiment of the present invention.

FIG. 3 shows a schematic diagram of decoder 302, according to an embodiment of the present invention. In some embodiments, decoder 302 operates in accordance with the MP2 encoding scheme. In other embodiments, decoder 302 may operate in accordance with a different encoding scheme.

During normal operation, audio decoder 302 receives DAB audio frames from an encoder (e.g., such as from encoder 102). The DAB audio frames are unpacked by frame unpacking block 304. Reconstruction block 306 receives the unpacked frames and extracts a plurality of sub-band frames (e.g., 32 sub-band frames) from each unpacked frame. Each sub-band frame includes a plurality of PCM samples (e.g., 36 PCM samples). Error detection and concealment block 308 receives the plurality of sub-band frames, and detects corrupted PCM samples, e.g., in each sub-band. Error detection and concealment block 308 conceals any detected errors by using, e.g., a linear predictor to replace each corrupted PCM sample with a predicted PCM sample. Inverse filter bank 310 generates the PCM audio samples (arranged in frames) by mapping (i.e., recombining) the sub-band frames into recombined PCM frames.

In some embodiments, error detection and concealment block 308 may use a frame error flag as part of detecting corrupted PCM samples. For example, error detection and concealment block 308 may operate in pass-through mode (e.g., without checking for corrupted PCM samples or by ignoring any detected errors) when the frame error flag is deasserted (e.g., in a low state). When the frame error flag is asserted (e.g., in a high state), error detection and concealment block 308 is enabled for the flagged frame. Error detection and concealment block 308 then checks for corrupted PCM samples in the flagged frame, and replaces corrupted PCM samples with predicted samples. The frame error flag may be asserted, for example, when a CRC check fails during reconstruction by reconstruction block 306.

Other embodiments may operate without receiving frame error flag or by ignoring the frame error flag. For example, some embodiments may continuously check for corrupted PCM samples and continuously replace corrupted PCM samples with predicted samples.

Decoder 302 may operate in accordance with the MP2 encoding scheme. In some embodiments, decoder 302 operates in accordance with a different encoding scheme. For example, in some embodiments more than 32 frequency sub-bands (e.g., 36, 64, etc.) or less than 32 frequency sub-bands, (e.g., 28, 16, etc.) may be used.

Decoder 302 may be implemented with a general purpose digital signal processor (DSP) that includes, for example, combinatorial circuits coupled to a memory. In some embodiments, the DSP may be implemented with an ARM architecture, for example. In some embodiments, decoder 302 may be implemented with an application-specific integrated circuit (ASIC). Other implementations are also possible. For example, some embodiments may implement decoder 302 using software running in a general purpose micro-controller or processor having, for example, a CPU coupled to a memory and implemented with an ARM or x86 architecture. Other implementations are also possible. Some embodiments may be implemented as a combination of hardware accelerator and software running on a DSP or general purpose micro-controller.

Figure 4:
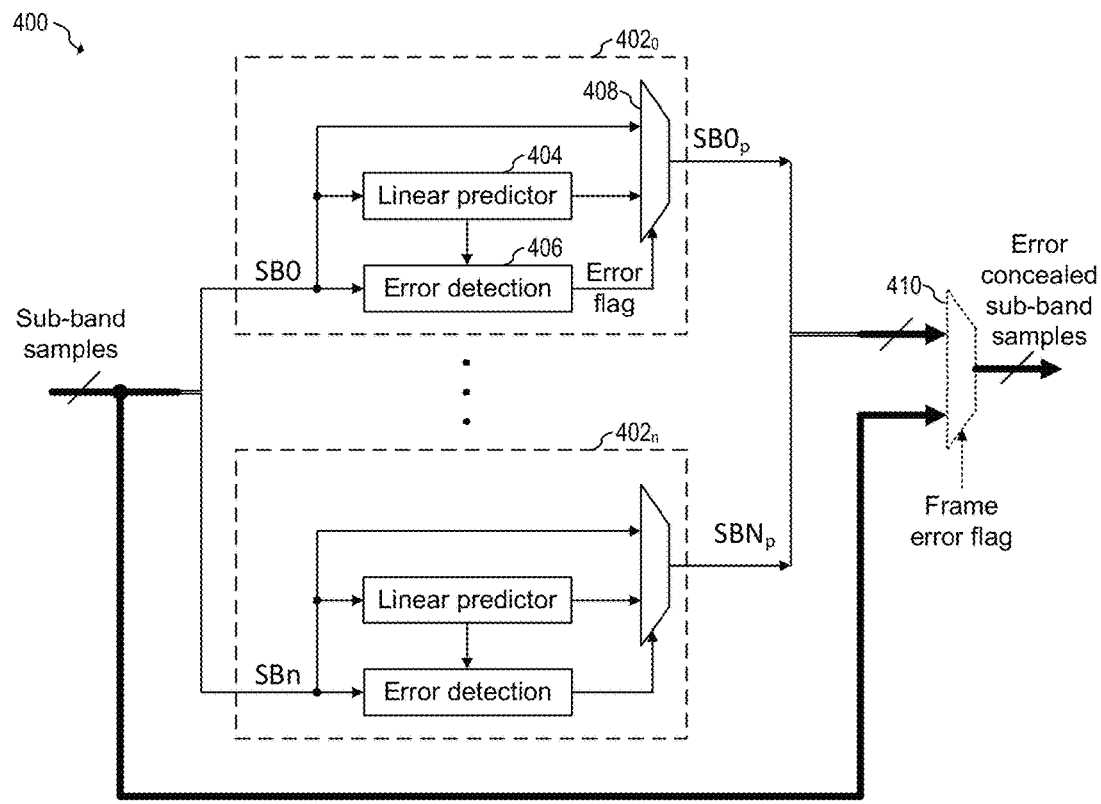
FIG. 4 shows a schematic diagram of an error detection and concealment block, according to an embodiment of the present invention.

FIG. 4 shows a schematic diagram of error detection and concealment block 400, according to an embodiment of the present invention. Error detection and concealment block 308 may be implemented as error detection and concealment block 400, for example.

As shown in FIG. 4, error detection and concealment block 400 includes an error detection and concealment sub-block 402 per frequency sub-band. For example, in some embodiments (such as in some embodiments implementing MP2 encoding scheme), error detection and concealment block 400 includes 32 error detection and concealment sub-blocks 402 (from sub-block $402_0$ to sub-block $402_{31}$). Each of the error detection and concealment sub-blocks 402 operates in a similar manner.

As shown in FIG. 4, each error detection and concealment sub-block 402 includes linear predictor block 404, error detection block 406, and selector block 408. During normal operation, linear predictor block 404 predicts a current sample (for the respective sub-band) based on, e.g., other samples (e.g., previous samples) of, e.g., the same sub-band. The current predicted PCM sample is compared with the original current PCM sample by error detection block 406 to generate a prediction error for the current PCM sample. If the absolute value of the prediction error is greater than a threshold, an error flag corresponding to the index of the current PCM sample is asserted. Selector block 408 selects the predicted PCM sample generated by linear predictor block 404 when the error flag is asserted. Selector block 408 selects the original PCM sample when the error flag is deasserted.

In some embodiments, by replacing only the identified corrupted PCM samples in a sub-band frame, error detection and concealment sub-block 402 advantageously uses most of the original audio samples of a corrupted frame (which has a plurality of sub-bands) while removing audible artifacts (e.g., such as clicks and pops).

In some embodiments, selector block 408 is implemented or includes a multiplexer (MUX).

In some embodiments, selector block 408 may also smooth transitions between the original PCM sample and the predicted PCM sample. For example, in some embodiments selector block 408 regulates the transition between the original PCM sample and the predicted PCM sample by using a fading window. For example, in some embodiments, the selector block 408 provides a weighted output given by $$y(n)=w(n-i)\cdot x_0(n)+[1-w(n-i)]\cdot \hat{x}_p(n) \tag{1}$$

where i corresponds to the time index where the error is detected, y(n) is the output of selector block 408, $x_0(n)$ is the original PCM sequence, $\hat{x}_p(n)$ is the predicted PCM sequence, and w(n) is a factor (weight) between 0 and 1. For example, in some embodiments, weight w(n) gradually transitions (e.g., over 5 PCM samples) from 1 to 0 and back to 1, where weight w(0) has the value 0. Different implementations, such as using a 3 sample fading window, or by changing the values of weight w(n) (e.g., $y(n)=[1-w(n-i)]\cdot x_0(n)+w(n-i)\cdot \hat{x}_p(n)$), are also possible. In embodiments that receive the frame error flag, weight w(n) may be based on the frame error flag.

In some embodiments, weight w gradually transitions over a plurality of PCM samples from a high weight to a low weight and back to the high weight, where the high weight is slightly lower than 1 (e.g., 0.9) and the low weight is slightly higher than 0 (e.g., 0.1). In some embodiments, the high weight and low weight values are predetermined. In other embodiments, the high weight and low weight values are dynamically determined, e.g., based on the absolute value of the prediction error. In some embodiments, using a low weight that is higher than 0 advantageously reduces side effects due to possible triggering of a false error detection.

Some embodiments include optional MUX 410. MUX 410 places in pass-through mode error detection and concealment block 400 when the frame error flag (e.g., received from reconstruction block 306) is deasserted, and selects data from the plurality of error detection and concealment sub-blocks 402 when the frame error flag is asserted. Some embodiments may implement the mode selection of error detection and concealment block 400 in other ways.

In some embodiments, continuing to run error detection and concealment block 400 when in pass-through mode advantageously maintains synchronization between the sub-band samples received by error detection and concealment block 400 and the sub-band samples generated by the plurality of error detection and concealment sub-blocks 402.

As shown in FIG. 4, error detection and concealment block 400 includes an error detection and concealment sub-block 402 for each sub-band. Other embodiments may include error detection and concealment sub-block 402 for some, but not all of the sub-bands. For example, some embodiments having 32 sub-bands (such as in embodiments implement the MP2 encoding scheme) may include error detection and concealment sub-block 402 for the low frequency sub-bands, such as sub-bands SB0 and SB1 only (the other sub-bands may be pass-through). Some embodiments may include more than two error detection and concealment sub-blocks 402 for the low-frequency sub-bands, such as twelve error detection and concealment sub-blocks 402 for sub-bands SB0 to SB11. A different number of error detection and concealment sub-block 402 may be used.

In some embodiments, the error detection and concealment sub-blocks 402 may be enabled or disabled based on the content of the audio data. For example, if the audio content is a 500 Hz tone, error detection and concealment sub-block $402_0$ may be the only one enabled. If the audio content is human voice, the error detection and concealment sub-blocks 402 corresponding to the high frequency sub-bands (e.g., SB24 to SB31) may be disabled. Other implementations are also possible.

In some embodiments, linear predictor block 404 may be implemented as a forward linear predictor (e.g., using Levinson's recursion), as a backward predictor, or as a combination thereof. For example, in some embodiments, linear predictor block 404 uses a Lattice method, such as Burg's method, which is based on a combination of forward and backward predictors.

For example, some embodiments may use Burg's method that combines forward and backwards predictors. In some embodiments, using Burg's method advantageously allows for improved error concealment in audio signals that exhibit instantaneous spectral variations, such as attack of a new musical note, e.g., in a piano.

Some embodiments independently implement forward and backward predictors (e.g., using Levinson's recursion for both) and then combine the forward and backward predictors using a weighted combination of the two. Other implementations are also possible.

Linear predictor 404 may be implemented, for example, using a finite impulse response (FIR) filter. Other implementations are also possible.

In some embodiments, the linear predictor can be replaced by a generic polynomial predictor, either in forward or backward direction, or combining both.

Figure 5:
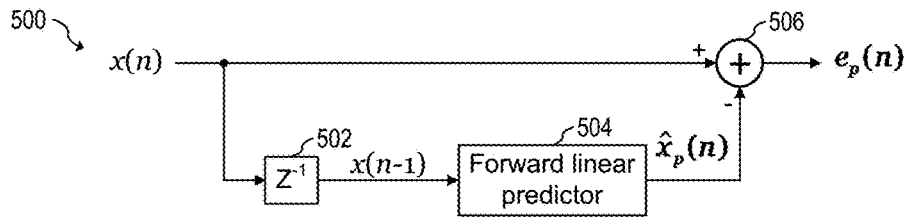
FIG. 5 shows a schematic diagram of a forward linear predictor block, according to an embodiment of the present invention.

FIG. 5 shows a schematic diagram of error generation block 500, for the generation of the prediction error signal, according to an embodiment of the present invention. Error generation block 500 includes delay block 502, forward linear predictor block 504 and differential node 506. For example, linear predictor 404 may be implemented as elements 502 and 504, whereas error detection 406 may be implemented as differential node 506, followed by threshold comparison.

As shown in FIG. 5, output $e_p(n)$ may be given by:

$$e_p(n) = x(n) - \hat{x}_p(n) \quad (2)$$

where forward linear predictor sub-block 504 may generate output $\hat{x}_p(n)$ as:

$$\hat{x}_p(n) = -\sum_{i=1}^{p} a_{p,i} \cdot x(n-i) \quad (3)$$

where p is the prediction order, and $a_{p,i}$ are predetermined coefficients. The resulting output $e_p(n)$, thus, may be given by:

$$e_p(n) = x(n) + \sum_{i=1}^{p} a_{p,i} \cdot x(n-i) \quad (4)$$

In some embodiments, coefficients $a_{p,i}$ are updated (e.g., with constant update interval $N_p$ or with different strategies) to take into account statistical variations in the received signals. In some embodiments, coefficients $a_{p,i}$ may be determined to minimize $E[|e_p(n)|^2]$, where $E[\cdot]$ is the statistical expectation operator and $e_p(n)$ is given, e.g., by Equation 4.

In some embodiments, this is equivalent to solving the linear system:

$$E[e_p(n) \cdot x^*(n-i)] = 0, \quad 1 \leq i \leq p \quad (5)$$

In some embodiments, the statistical expectation can be estimated directly from the received data using, e.g., well known methods, such as autocorrelation method, covariance method, etc. In some embodiments, such as in an embodiment using autocorrelation method, it is possible to use optimized algorithms, such as Levinson's recursion, to solve the linear system above. Levinson's recursion, for example, may allow for calculating the coefficients related to the predictor of order p+1 (i.e., $a_{p+1,i}$, for $1 \leq i \leq p+1$), starting from the coefficients related to the predictor of order p (i.e., $a_{p,i}$, for $1 \leq i \leq p$).

The prediction error of forward linear predictor block 500 decreases as the order p of the predictor increases until a whitening effect is achieved (in which no significant reduction in error is achieved by an additional increase in the predictor order, such as less than 5% change, in some embodiments). The update interval $N_p$ also affects the prediction error. For example, the prediction error increases as the update interval $N_p$ increases.

Figure 6A:
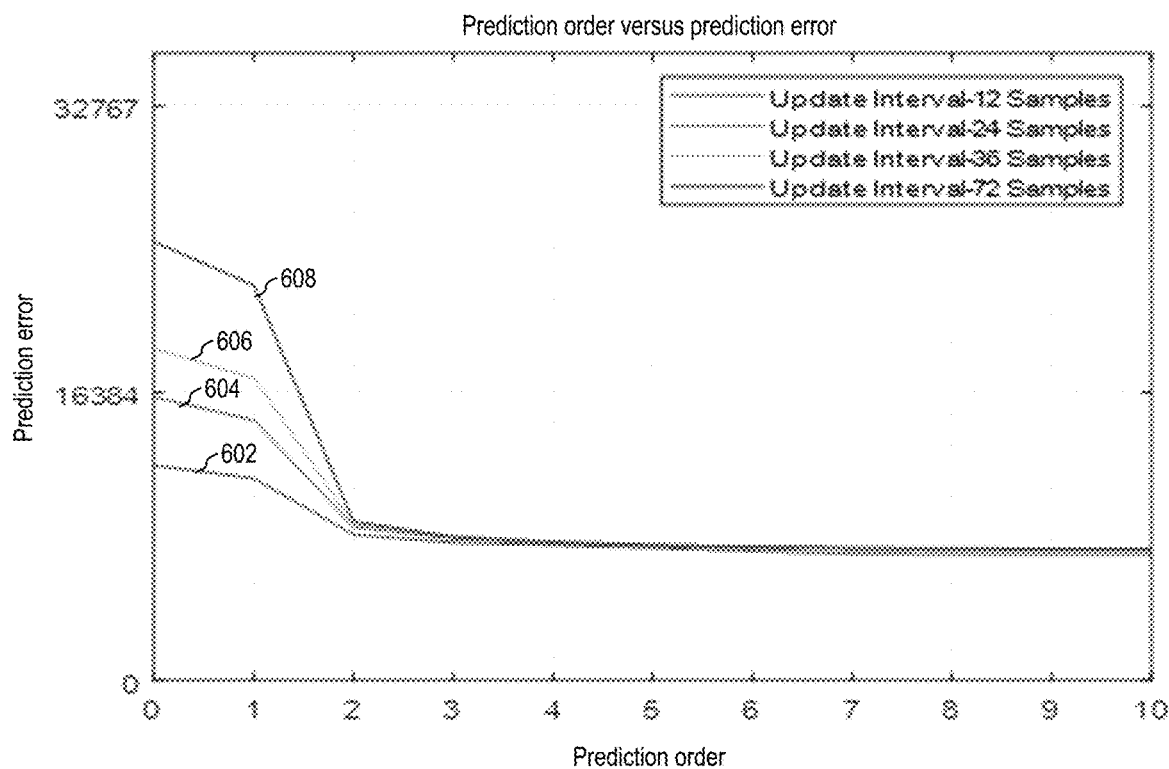
FIGS. 6A and 6B show prediction error versus predictor order for a sinewave (with update intervals of 12, 24, 36, and 72 samples) and piano music (with update intervals of 72, 108, 144, and 180 samples), respectively, according to an embodiment of the present invention.
Figure 6B:
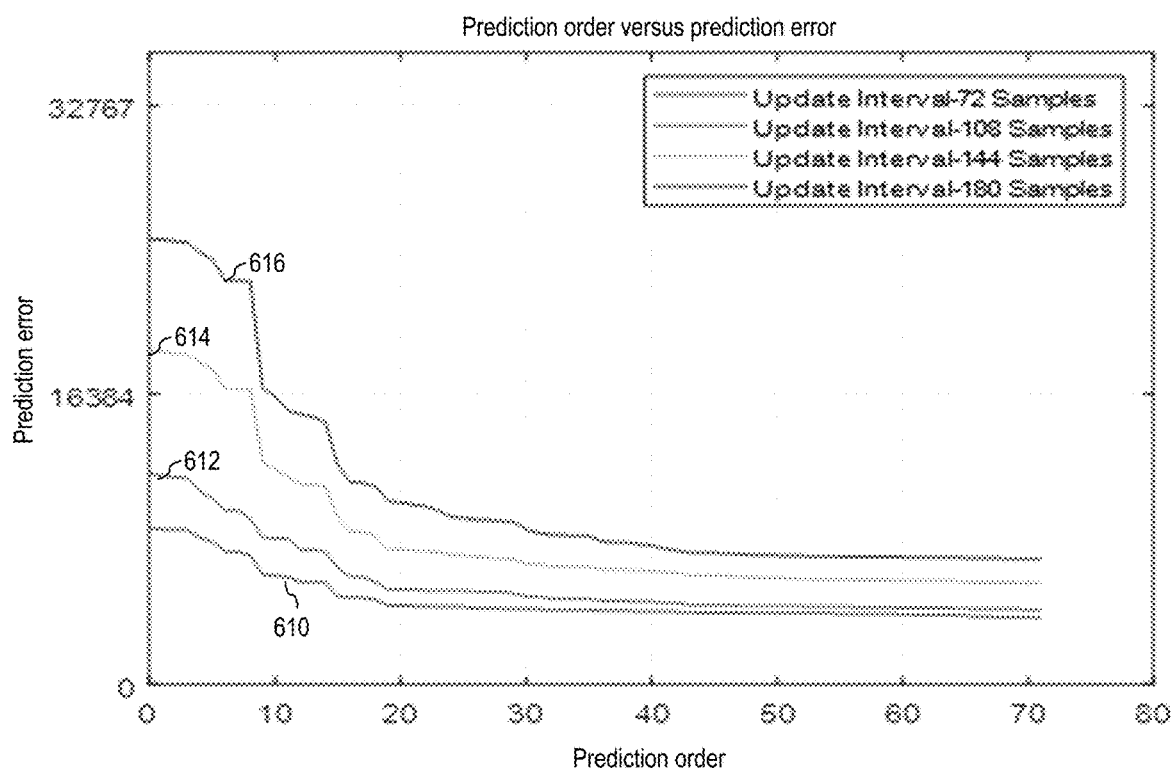

FIGS. 6A and 6B show prediction error versus predictor order for a sinewave and piano music, respectively, according to an embodiment of the present invention. Curves 602, 604, 606, and 608 correspond to update intervals of 12, 24, 36, and 72 samples, respectively. Curves 610, 612, 614, and 616 correspond to update intervals of 72, 108, 144, and 180 samples, respectively. Some embodiments use the update interval $N_p$ equal to the number of samples in a frame (e.g., 36 samples). Other embodiments may use an update interval with fewer samples than the frame (e.g., 12 samples) or a multi-frame update interval (e.g., 72 samples).

For the example of FIG. 6A, whitening is achieved when the predictor order p is equal to 2. For the example of FIG. 6B, whitening is achieved when the predictor order p is equal to 35. In some embodiments, the predictor order is set to the highest predictor order before reaching whitening (e.g., 3 or more for FIG. 6A; 36 or more for FIG. 6B). In some embodiments, the predictor order p may be obtained, for example, by stopping the Levinson's recursion when whitening is achieved (e.g., when the reduction in error is smaller than a predetermined threshold).

Some embodiments advantageously determine the order of the predictor p, the update interval $N_p$, the data window for calculation of predictor coefficients $a_{p,i}$, and/or the predictor coefficients $a_{p,i}$ based on characteristics of the audio signal. For example, some embodiments may use an external indication (e.g., user input), or information from spectral analysis (e.g., an FFT) of the audio data to select the order of the predictor p, the update interval $N_p$, the data window for calculation of predictor coefficients $a_{p,i}$, and/or the predictor coefficients $a_{p,i}$. In some embodiments, the order of the predictor p, the update interval $N_p$, the data window for calculation of predictor coefficients $a_{p,i}$, and/or the predictor coefficients $a_{p,i}$ is/are selected based on the spectral analysis of the corresponding sub-band frame. In other embodiments, the order of the predictor p, the update interval $N_p$, the data window for calculation of predictor coefficients $a_{p,i}$, and/or the predictor coefficients $a_{p,i}$ is/are selected based on the spectral analysis of the audio data (before sub-band decomposition). Other implementations are also possible.

For example, in some embodiments, the prediction order p is selected by dedicating two predictor coefficients $a_{p,i}$ for each spectral peak associated with the corresponding frequency sub-band frame plus, e.g., three margin predictor coefficients.

Figure 7:
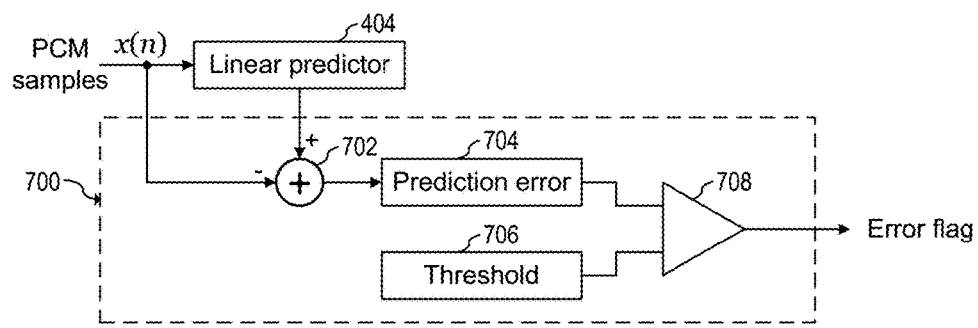
FIG. 7 shows an error detection block, according to an embodiment of the present invention.

FIG. 7 shows error detection block 700, according to an embodiment of the present invention. Error detection block 700 includes adder 702 and comparator 708. Error detection block 406 may be implemented as error detection block 700, for example.

During normal operation, prediction error 704 is generated for each PCM sample by subtracting the output of linear predictor block 404 with the respective original PCM sample. Comparator 708 performs a comparison based on each prediction error 704 with threshold 706 to determine whether an error exist in the corresponding PCM sample. The output of comparator 708 is asserted when an error is detected. Otherwise, the output of comparator 708 is deasserted.

Figure 8A:
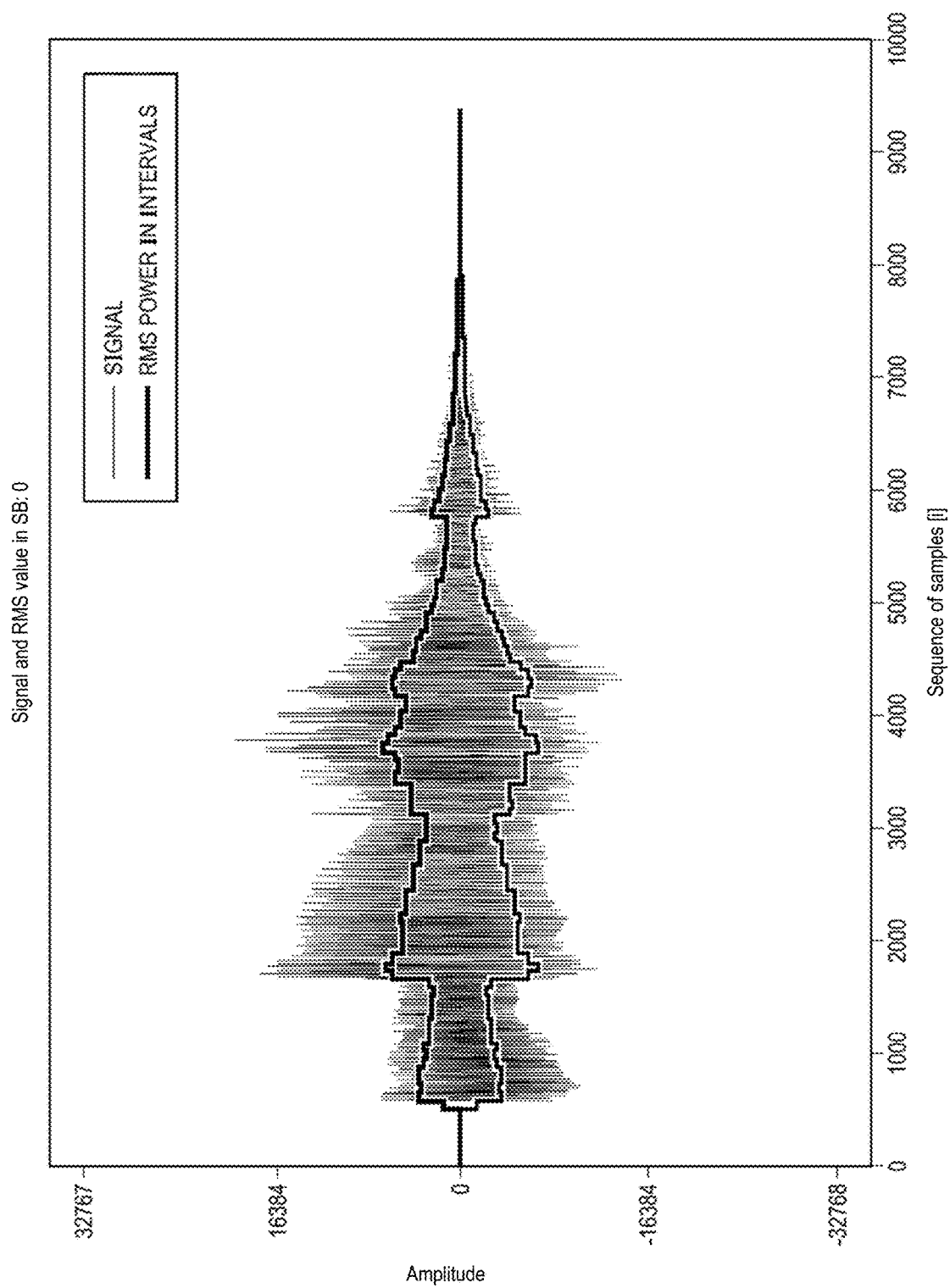
FIG. 8A shows a piano signal and corresponding root mean square (RMS) value.

In some embodiments, threshold 706 is based on the RMS value of the audio signal under processing (e.g., the RMS value of the signal in the sub-band frame being processed). For example, the sub-band RMS value $x_{RMS}$ may be determined by:

$$x_{RMS} = \sqrt{\frac{1}{N_p} \cdot \sum_{n=1}^{N_p} [x(n)]^2} \qquad (6)$$

where $N_p$ is the update interval, and $x(n)$ are the samples of the audio signal in the sub-band frame considered. In such embodiments, the instantaneous absolute value of the prediction error is compared with a threshold, where the threshold is a percentage of the sub-band RMS value $x_{RMS}$, e.g., calculated with Equation 6. In some embodiments, the threshold is between 10% and 30% of the sub-band RMS value $x_{RMS}$. FIG. 8A shows a piano signal and corresponding RMS value.

Figure 8B:
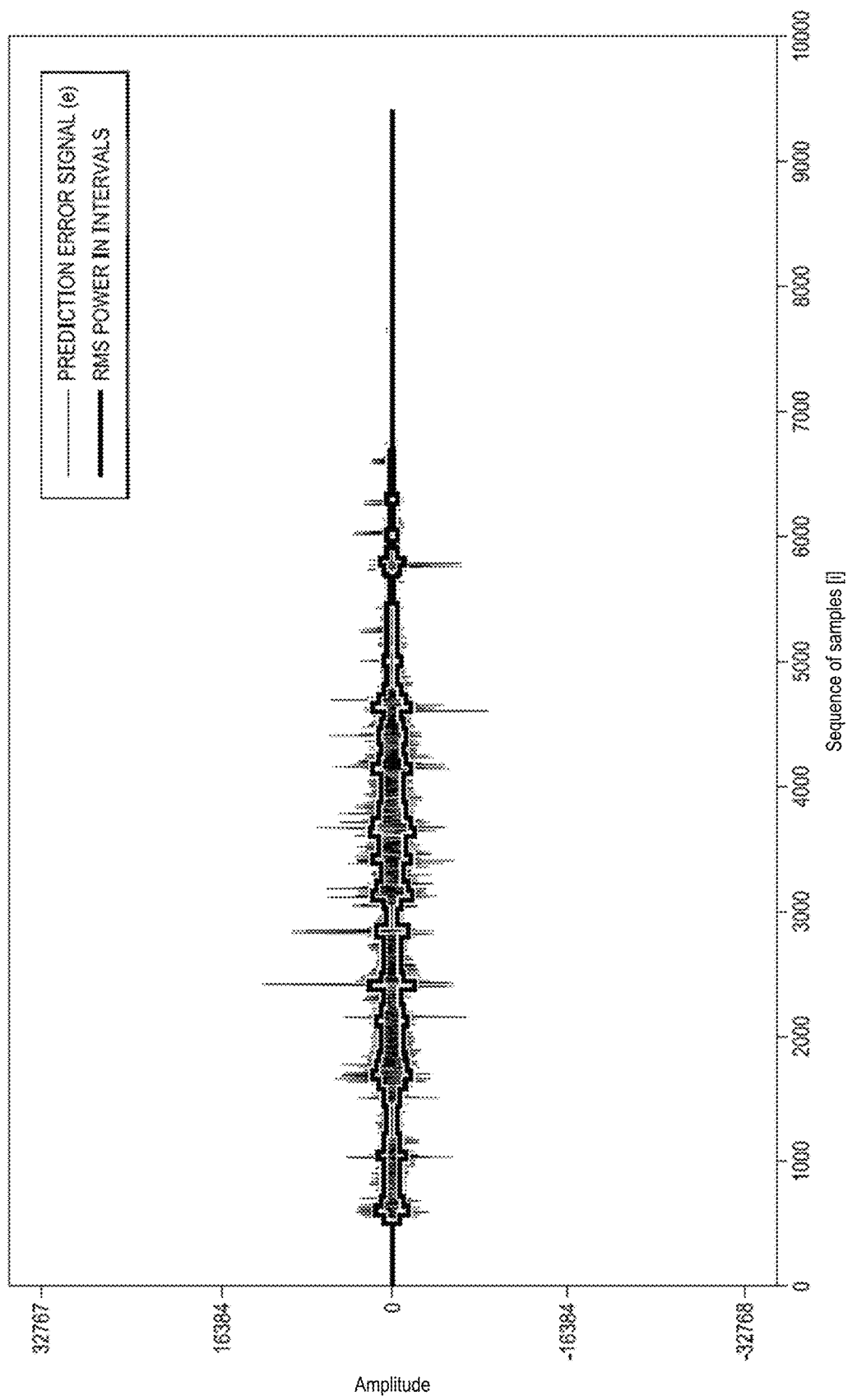
FIG. 8B shows a prediction error signal of the piano signal of FIG. 8A, and corresponding RMS value.

Some embodiments may determine the threshold based on the absolute value of the prediction error in the frame under processing. For example, such embodiments may determine the sub-band prediction error RMS value by:

$$e_{p,RMS} = \sqrt{\frac{1}{N_p} \cdot \sum_{n=1}^{N_p} [e_p(n)]^2} \qquad (7)$$

where $e_p(n)$ are the samples of the prediction error in the sub-band frame considered. In such embodiments, the instantaneous absolute value of the prediction error is compared with a threshold, where the threshold is a percentage of the sub-band prediction error RMS value $e_{p,RMS}$, e.g., calculated with Equation 6. In some embodiments, the threshold is between 100% and 300% of the sub-band RMS value $e_{p,RMS}$. FIG. 8B shows a prediction error signal of the piano signal of FIG. 8A, and corresponding RMS value.

Advantages of some embodiments include improved error detection by comparing the instantaneous absolute value of a prediction error sample with a threshold that is based on the RMS value of the sub-band frame or the RMS value of the prediction error frame.

In some embodiments, the percentage used for threshold 706 may be dynamically adapted based on the content of the PCM samples. For example, in some embodiments, the percentage of the RMS value $x_{RMS}$ is adapted based on spectral analysis (e.g., an FFT) of the sub-band frame considered. For example, in sub-band frames having strongly concentrated power around a reduced number of frequencies, the threshold may be set between 10% and 30%. When the sub-band frames exhibit a signal spectrum that is distributed over a wide range of frequencies, the threshold may be set between 70% and 200%. The percentages for the threshold may be adjusted based on the number of frequency peaks and the steepness of the frequency peaks, for example.

Other embodiments may dynamically change the percentage of the RMS value $x_{RMS}$ based on, e.g., an FFT of either sub-band signal or sub-band prediction error inside the considered frame. Other implementations are also possible.

Figure 8C:
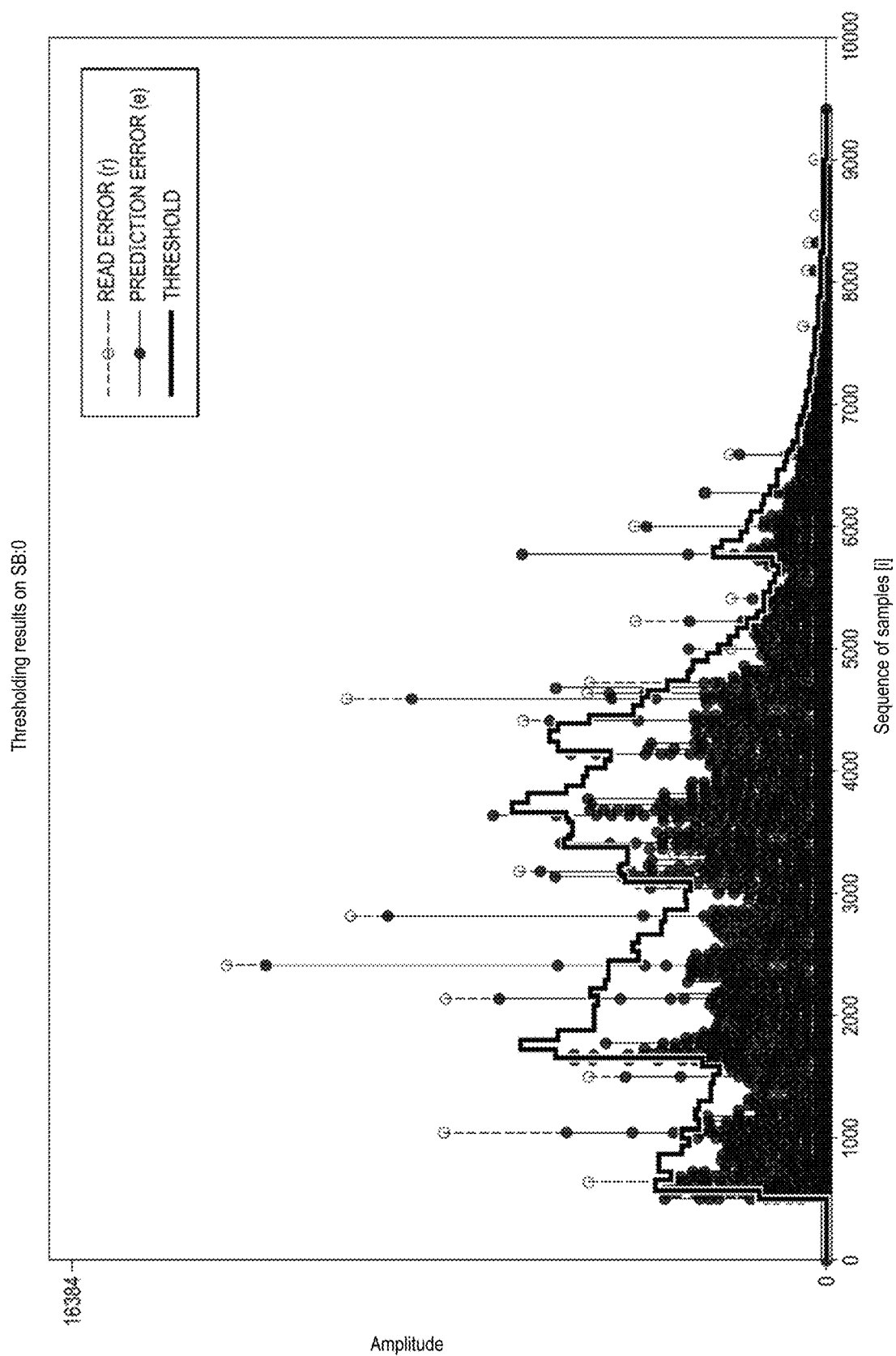
FIG. 8C shows a graph of a prediction error signal, associated threshold, and real errors, according to an embodiment of the present invention.

FIG. 8C shows a graph of a prediction error signal, associated threshold, and real errors, according to an embodiment of the present invention. As shown in FIG. 8C, 37 errors were detected.

Figure 8D:
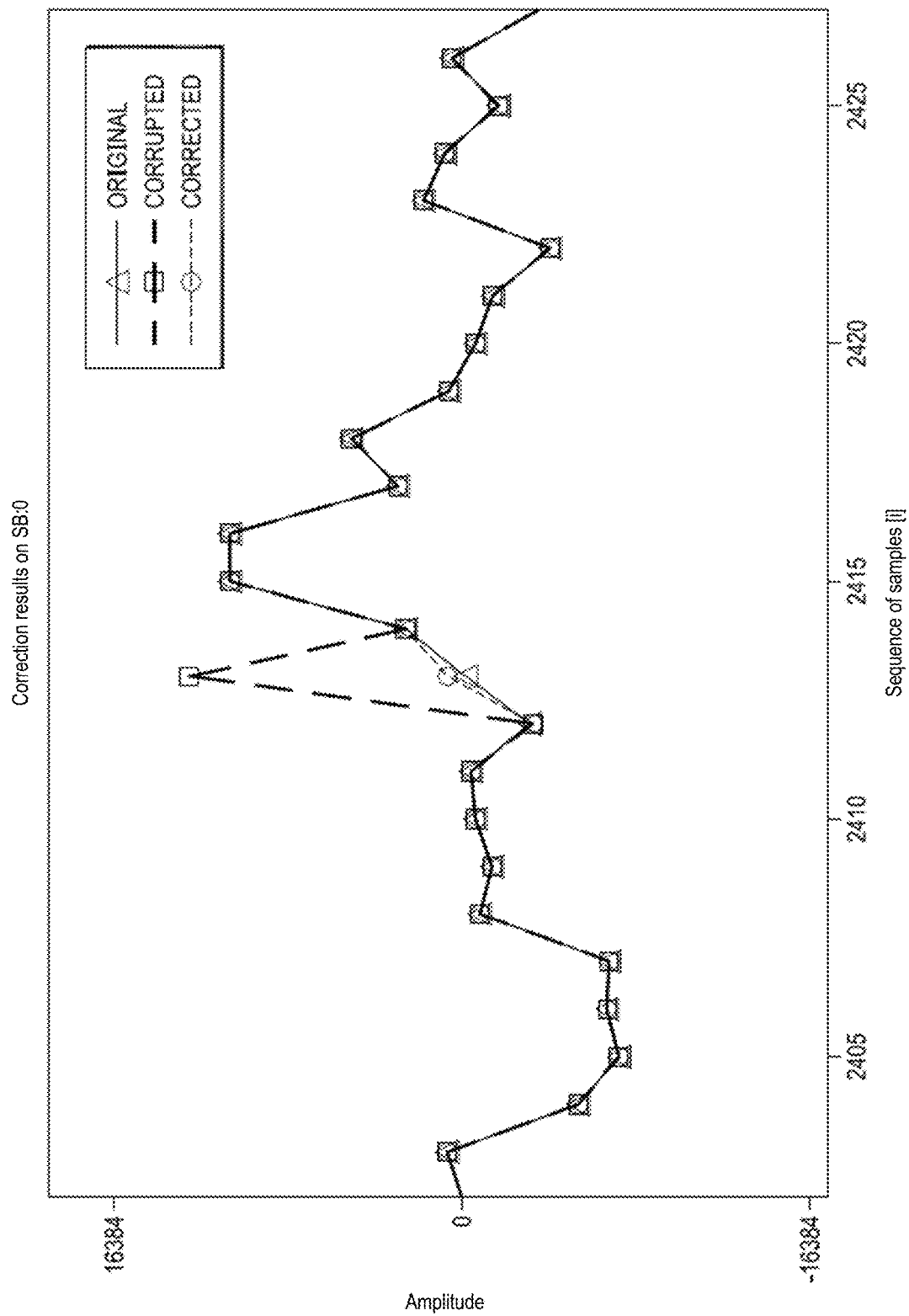
FIG. 8D shows a zoomed-in version graph of a corrected error detected at a particular index in FIG. 8C.

FIG. 8D shows a zoomed-in version graph of the corrected error detected at index 2413 in FIG. 8C. As shown in FIG. 8D, the corrected sample at index 2413 is substantially closer to the original sample than the corrupted sample.

Figure 9:
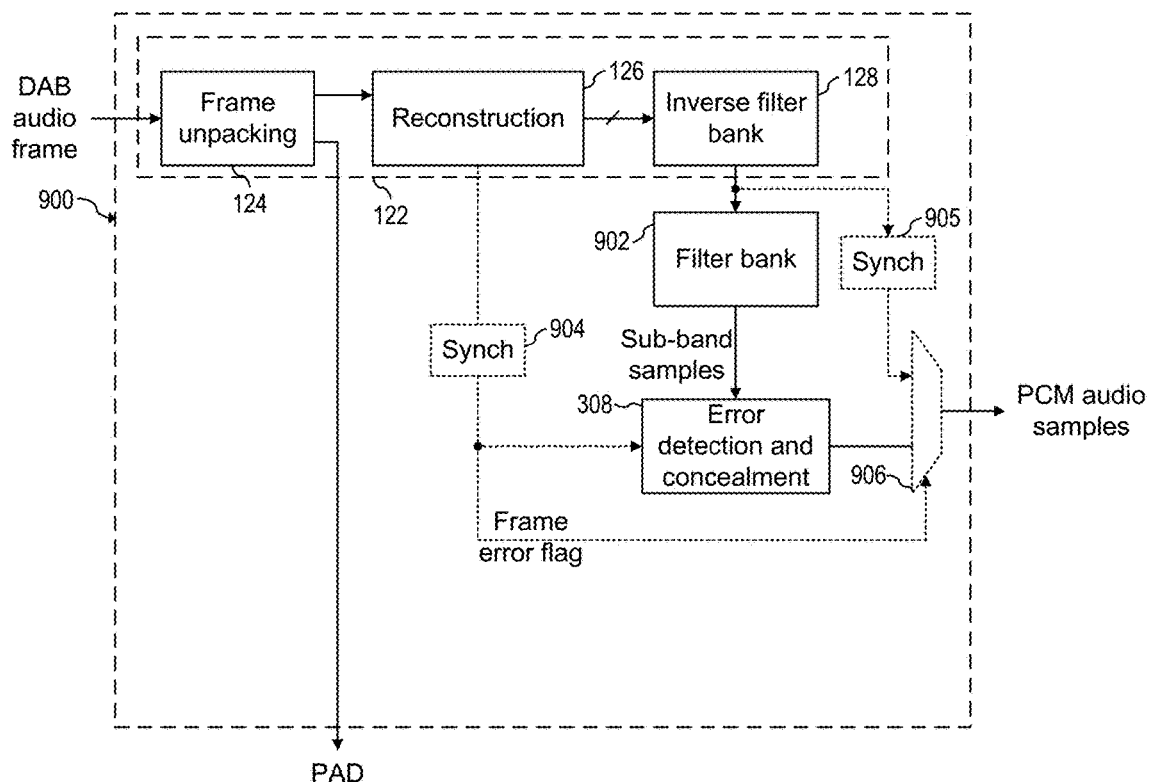
FIG. 9 shows a schematic diagram of a decoder, according to an embodiment of the present invention.

Error detection and concealment block 308 may be implemented inside a decoder, such as shown in FIG. 3. In some embodiments, error detection and concealment block 308 may be implemented at the output of a decoder. In some embodiments, implementing error detection and concealment block 308 at the output of a decoder advantageously allows for performing error detection and concealment in audio decoders that do not provide access to internal sub-band signals. For example, FIG. 9 shows a schematic diagram of decoder 900, according to embodiment of the present invention. As shown in FIG. 9, decoder 900 includes decoder 122 coupled to filter bank 902 and error detection and concealment block 308.

During normal operation, filter bank 902 receives PCM audio data from inverse filter bank 128 and creates a plurality of frequency sub-bands (e.g., the same frequency sub-bands present in the DAB audio frame). Error detection and concealment block 308 detects and conceals errors in the sub-band samples.

In some embodiments, error detection and concealment block 308 receives frame error flag from decoder 122 and selects the mode of error detection and concealment block 308 in a similar manner than error detection and concealment block 400, as shown in FIG. 4. In such embodiments, synchronization block 904 may be used to align the frame error flag (e.g., by delaying the frame error flag) with PCM samples being processed by error detection and concealment block 308.

In other embodiments, optional MUX 906 is used to pass-through samples from inverse filter bank 128 when frame error flag is not asserted. Synchronization blocks 904 and 905 may be used to align the frame error flag with PCM samples being processed by error detection and concealment block 308 to allow for a seamless transition between pass-through mode and concealment mode. In some embodiments, by placing decoder 900 in pass-through mode when frame error flag is not asserted, error detection and concealment block 900 advantageously avoids any distortion created by decomposing the signals into sub-bands (by filter bank 902).

Filter bank 902 is configured to create a plurality of frequency sub-bands based on the received PCM samples. In some embodiments, the same frequency sub-bands used by the preceding encoder and decoder pair (e.g., encoder 102 and decoder 122) are used. In some embodiments, performing error detection and concealment with the same frequency sub-band decomposition used by a corresponding encoder during transmission advantageously increases performance of error detection and concealment since errors during sub-band transmission result in bits flipped in the same transmitted sub-bands.

Although decoder 900 is illustrated in FIG. 9 operating with decoder 122, it is understood that decoder 900 may operate in a similar manner with other types of decoders (e.g., decoders operating with an encoding scheme different than MP2).

Example embodiments of the present invention are summarized here. Other embodiments can also be understood from the entirety of the specification and the claims filed herein.

Example 1. A method including: receiving an audio frame; decomposing the received audio frame into M sub-band pulse-code modulation (PCM) audio frames, where M is a positive integer number; predicting a PCM sample of one sub-band PCM audio frame of the M sub-band PCM audio frames; comparing the predicted PCM sample with a corresponding received PCM sample to generate a prediction error sample; comparing an instantaneous absolute value of the prediction error sample with a first threshold; and replacing the corresponding received PCM sample with a value based on the predicted PCM sample when the instantaneous absolute value of the prediction error sample is greater than the first threshold.

Example 2. The method of example 1, where M is 32.

Example 3. The method of one of examples 1 or 2, further including: decomposing a PCM audio frame into the M sub-band PCM audio frames; encoding the M sub-band PCM audio frames into an encoded audio frame; transmitting the encoded audio frame; and unpacking the encoded audio frame to generate the audio frame.

Example 4. The method of one of examples 1 to 3, further including: computing an RMS value of the one sub-band PCM audio frame; and determining the first threshold for the one sub-band, based on the computed RMS value.

Example 5. The method of one of examples 1 to 4, further including: computing respective RMS values of each of the M sub-band PCM audio frames, where computing the respective RMS values of each of the M sub-band PCM audio frames includes computing the RMS value of the one sub-band PCM audio frame; determining respective thresholds based on the computed respective RMS values of each of the M sub-band PCM audio frames, where determining the respective thresholds includes determining the first threshold; comparing respective instantaneous absolute values of respective prediction error samples of each of the M sub-band PCM audio frames with the respective thresholds, where comparing the respective instantaneous absolute values of the respective prediction error samples of each of the M sub-band PCM audio frames with the respective thresholds includes comparing the instantaneous absolute value of the prediction error sample with the first threshold; and replacing corresponding received PCM samples with respective values based on predicted PCM samples when the respective instantaneous absolute values of the respective prediction error samples are greater than the respective thresholds, where replacing the corresponding received PCM samples with the respective values based on the predicted PCM samples includes replacing the corresponding received PCM sample with the value based on the predicted PCM sample.

Example 6. The method of one of examples 1 to 5, further including: generating a prediction error frame including prediction error samples corresponding to received PCM samples in the one sub-band PCM audio frame; computing an RMS value of the prediction error frame; and determining the first threshold as a percentage of the computed RMS value.

Example 7. The method of one of examples 1 to 6, where the percentage is between 70% and 200%.

Example 8. The method of one of examples 1 to 7, further including: receiving an encoded frame using an MPEG Version 1 Layer II (MP2) decoder; and generating the audio frame with the MP2 decoder.

Example 9. The method of one of examples 1 to 8, where predicting the PCM sample includes using the method of Levinson's recursion.

Example 10. The method of one of examples 1 to 9, further including: performing spectral analysis of the one sub-band PCM audio frame; determining a predicting order based on the performed spectral analysis; and predicting the PCM sample using a linear predictor of the determined predicting order.

Example 11. The method of one of examples 1 to 10, where the one sub-band PCM audio frame includes a frequency span between 3000 Hz and 3750 Hz.

Example 12. The method of one of examples 1 to 11, where the audio frame is an AM High Definition (AM HD) audio frame, an FM High Definition (FM HD) audio frame, a digital audio broadcasting (DAB) audio frame, a DAB+ audio frame, or a Digital Radio Mondiale (DRM) audio frame.

Example 13. A digital audio broadcasting (DAB) receiver including: a frame unpacking block configured to receive an encoded frame; a reconstruction block configured to generate M sub-band frames based on the encoded frame; a linear predictor configured to receive one sub-band frame of the M sub-band frames and to generate a predicted sample based on a corresponding received sample; a first block configured to generate a prediction error based on the predicted sample and the corresponding received sample; a comparator configured to assert a flag when an instantaneous absolute value of the prediction error is higher than a threshold; and a selector block configured to select the predicted sample when the flag is asserted.

Example 14. The DAB receiver of example 13, further including a second selector block including: a selection input configured to receive a frame error flag; a first input configured to receive original PCM samples; and a second input configured to receive PCM samples from the selector block; and an output, where the second selector block is configured to: connect the output of the second selector block to the first input of the second selector block when the frame error flag is deasserted, and connect the output of the second selector block to the second input of the second selector block when the frame error flag is asserted.

Example 15. The DAB receiver of one of examples 13 or 14, where the selection input of the second selector block is configured to receive the frame error flag from the reconstruction block.

Example 16. A method of concealing an error in a pulse-code modulation (PCM) audio frame encoded with an MPEG Version 1 Layer II (MP2) encoding scheme, the method including: receiving the PCM audio frame; decomposing the received PCM audio frame into 32 sub-band PCM audio frames; predicting a PCM sample of one sub-band PCM audio frame of the 32 sub-band PCM audio frames using a linear predictor based on PCM samples of the received PCM audio frame; comparing the predicted PCM sample with a corresponding received PCM sample to generate a prediction error sample; comparing an instantaneous absolute value of the prediction error sample with a threshold; and replacing the corresponding received PCM sample with the predicted PCM sample when the instantaneous absolute value of the prediction error sample is greater than the threshold.

Example 17. An audio decoder including: a frame unpacking block configured to receive an encoded frame; a reconstruction block configured to generate M sub-band frames based on the encoded frame; and an error detection and concealment block including: a linear predictor configured to receive one sub-band frame based on the M sub-band frames and to generate a predicted sample based on a corresponding received sample, an adder block configured to generate a prediction error based on the predicted sample and the corresponding received sample, a comparator configured to assert a flag when an instantaneous absolute value of the prediction error is higher than a threshold, and a selector block configured to select the predicted sample when the flag is asserted.

Example 18. The audio decoder of example 17, where the audio decoder is of the MPEG Version 1 Layer II (MP2) type.

Example 19. The audio decoder of one of examples 17 or 18, further including: an MPEG Version 1 Layer II (MP2) decoder that includes the frame unpacking block and the reconstruction block, the MP2 decoder configured to produce PCM audio samples based on the received encoded frames; and a filter bank configured to generate 32 sub-band frames based on the PCM audio samples received from the MP2 decoder, where the one sub-band frame is a sub-band frame of the 32 sub-band frames generated by the filter bank.

Example 20. The audio decoder of one of examples 17 to 19, further including a second error detection and concealment block including: a second linear predictor configured to receive a second sub-band frame based on the M sub-band frames and to generate a second predicted sample based on second corresponding received sample, a second adder block configured to generate a second prediction error based on the second predicted sample and the second corresponding received sample, a second comparator configured to assert a second flag when an instantaneous absolute value of the second prediction error is higher than a second threshold, and a second selector block configured to select the second predicted sample when the flag is asserted.

Example 21. The audio decoder of one of examples 17 to 20, where the error detection and concealment block is one of M error detection and concealment blocks, and where each error detection and concealment blocks is configured to: receive a respective sub-band frame based on a corresponding sub-band frame of the M sub-band frames; generate a respective predicted samples based on the corresponding received sample; generate a respective prediction error based on respective predicted samples and the corresponding received sample; assert a respective flag when an instantaneous absolute value of the respective prediction error is higher than a respective threshold; and select the respective predicted samples when the respective flag is asserted.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method comprising:
   receiving an audio frame;
   decomposing the received audio frame into M sub-band audio frames, wherein M is a positive integer number;
   predicting an audio sample of one sub-band audio frame of the M sub-band audio frames;
   comparing the predicted audio sample with a corresponding received audio sample to generate a prediction error sample; and
   replacing the corresponding received audio sample with a value based on the predicted audio sample based on the prediction error sample.

2. The method of claim 1, further comprising comparing an absolute value of the prediction error sample with a first threshold, wherein replacing the corresponding received audio sample with the value based on the predicted audio sample comprises replacing the corresponding received audio sample with the value based on the predicted audio sample when the absolute value of the prediction error sample is greater than the first threshold.

3. The method of claim 2, further comprising:
   determining an RMS value of prediction error samples of the one sub-band audio frame by $$e_{p,RMS} = \sqrt{\frac{1}{N_p} \sum_{n=1}^{N_p} [e_p(n)]^2} \qquad (8)$$

wherein $e_{p,RMS}$ represents the RMS value of the predicted error samples, $e_p(n)$ are prediction error samples of the one sub-band audio frame, and $N_p$ is an updated interval; and
   determining the first threshold based on the determined RMS value.

4. The method of claim 2, further comprising:
   determining a sub-band RMS value of received audio samples of the one sub-band audio frame by $$x_{RMS} = \sqrt{\frac{1}{N_p} \sum_{n=1}^{N_p} [x(n)]^2} \qquad (9)$$

wherein $x_{RMS}$ represents the sub-band RMS value of the received audio samples, $x(n)$ are received audio samples of the one sub-band audio frame, and $N_p$ is an updated interval; and
   determining the first threshold based on the determined sub-band RMS value.

5. The method of claim 4, wherein the first threshold is based on a first percentage of the determined sub-band RMS value, the method further comprising determining the first percentage based on a Fast Fourier Transform (FFT) of received audio samples of the one sub-band audio frame or on prediction error samples of the one sub-band audio frame.

6. The method of claim 1, wherein replacing the corresponding received audio sample with the value based on the predicted audio sample comprises replacing the corresponding received audio sample with the predicted audio sample.

7. The method of claim 1, wherein replacing the corresponding received audio sample with the value based on the predicted audio sample comprises replacing the corresponding received audio sample with a weighted output generated by using a fading window.

8. The method of claim 7, further comprising generating the weighted output by using the fading window as $$y(n)=w(n-i)\cdot x_0(n)+[1-w(n-i)]\cdot \hat{x}_p(n)$$

wherein y(n) represents the weighted output, i corresponds to a time index where an error is detected, $x_0(n)$ represents a received audio sample sequence corresponding to the one sub-band audio frame, $\hat{x}_p(n)$ represents a predicted audio sample sequence corresponding to the one sub-band audio frame, and w(n) is a weight factor between 0 and 1.

9. The method of claim 7, further comprising generating the weighted output by using the fading window as $$y(n)=[1-w(n-i)]\cdot x_0(n)+w(n-i)\cdot \hat{x}_p(n)$$

wherein y(n) represents the weighted output, i corresponds to a time index where an error is detected, $x_0(n)$ represents a received audio sample sequence corresponding to the one sub-band audio frame, $\hat{x}_p(n)$ represents a predicted audio sample sequence corresponding to the one sub-band audio frame, and w(n) is a weight factor between 0 and 1.

10. The method of claim 7, further comprising generating the weighted output by using the fading window by using a weight factor between 0 and 1.

11. The method of claim 10, wherein the weight factor is between 0.1 and 0.9.

12. The method of claim 10, further comprising dynamically determining the weight factor based on prediction error sample.

13. The method of claim 1, further comprising:
predicting N audio samples respective N sub-band audio frames of the M sub-band audio frames, wherein N is a positive integer greater than or equal to 1 and less than M, and wherein the N sub-band audio frames comprises the one sub-band audio frame; and
replacing the corresponding N received audio samples with respective values based on the respective predicted audio samples based on respective prediction error samples.

14. The method of claim 13, wherein the one sub-band audio frame is a lowest frequency sub-band audio frame of the M sub-band audio frames.

15. The method of claim 14, wherein the one sub-band audio frame has a frequency span between 0 Hz and 750 Hz.

16. The method of claim 13, wherein N is equal to 1.

17. The method of claim 13, wherein the N sub-band audio frames are a lowest frequency sub-band audio frames of the M sub-band audio frames.

18. The method of claim 17, wherein N is equal to 2.

19. The method of claim 1, wherein decomposing the received audio frame into M sub-band audio frames comprises decomposing the received audio frame into M sub-band pulse-code modulation (PCM) audio frames.

20. A digital audio broadcasting (DAB) receiver comprising:
a frame unpacking circuit configured to receive an encoded frame;
a reconstruction circuit configured to generate M sub-band frames based on the encoded frame;
a predictor configured to receive one sub-band frame of the M sub-band frames and to generate a predicted sample based on a corresponding received sample;
a first circuit configured to generate a prediction error based on the predicted sample and the corresponding received sample;
a comparator configured to assert a flag based on the prediction error; and
a selector circuit configured to select the predicted sample when the flag is asserted.

21. The DAB receiver of claim 20, wherein the reconstruction circuit is configured to assert a frame error flag when the encoded frame is corrupted, the DAB receiver further comprising a further selector circuit configured to select an output of the selector circuit based on the frame error flag.

22. The DAB receiver of claim 21, wherein the DAB receiver is configured to align the frame error flag with the output of the selector circuit.

23. The DAB receiver of claim 20, wherein the predictor is a linear predictor.

24. An audio decoder comprising:
a frame unpacking circuit configured to receive an encoded frame;
a reconstruction circuit configured to generate M sub-band frames based on the encoded frame; and
an error detection and concealment circuit comprising:
a predictor configured to receive one sub-band frame based on the M sub-band frames and to generate a predicted sample based on a corresponding received sample,
an adder configured to generate a prediction error based on the predicted sample and the corresponding received sample,
a comparator configured to assert a flag based on the prediction error, and
a selector circuit configured to select the predicted sample when the flag is asserted.

* * * * *